(12) United States Patent
Ishiyama

(10) Patent No.: US 10,825,882 B2
(45) Date of Patent: Nov. 3, 2020

(54) SEMICONDUCTOR DEVICE AND DISPLAY UNIT

(71) Applicant: JOLED INC., Tokyo (JP)

(72) Inventor: Yuichiro Ishiyama, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/234,564

(22) Filed: Dec. 28, 2018

(65) Prior Publication Data
US 2019/0214449 A1 Jul. 11, 2019

(30) Foreign Application Priority Data
Jan. 10, 2018 (JP) .................. 2018-001909

(51) Int. Cl.
| | | |
|---|---|---|
| *H01L 27/32* | (2006.01) | |
| *H01L 51/00* | (2006.01) | |
| *H01L 51/56* | (2006.01) | |
| *H01L 25/16* | (2006.01) | |

(52) U.S. Cl.
CPC ........ *H01L 27/3272* (2013.01); *H01L 25/167* (2013.01); *H01L 51/0097* (2013.01); *H01L 51/56* (2013.01)

(58) Field of Classification Search
CPC ............. H01L 27/3272; H01L 51/5268; H01L 27/322; G02F 1/133617; G02B 5/0263
See application file for complete search history.

(56) References Cited

U.S. PATENT DOCUMENTS

| | | | |
|---|---|---|---|
| 9,523,876 B2 | 12/2016 | Kim | |
| 2005/0122042 A1 | 6/2005 | Kang et al. | |
| 2007/0295973 A1* | 12/2007 | Jinbo | .................. H01L 27/1214 257/88 |
| 2008/0090338 A1 | 4/2008 | Tredwell et al. | |
| 2012/0127063 A1 | 5/2012 | Ohno et al. | |
| 2012/0161197 A1 | 6/2012 | Im et al. | |
| 2017/0179210 A1 | 6/2017 | Kimura et al. | |
| 2017/0207407 A1* | 7/2017 | Liao | ........................ H01L 51/56 |
| 2017/0309844 A1 | 10/2017 | Saeki et al. | |
| 2017/0364927 A1* | 12/2017 | Atkinson | ......... G06K 19/06112 |
| 2018/0004023 A1 | 1/2018 | Ide et al. | |
| 2018/0120646 A1* | 5/2018 | Lee | ...................... H01L 51/5268 |
| 2019/0058013 A1* | 2/2019 | Lee | ........................ H01L 27/322 |

FOREIGN PATENT DOCUMENTS

| | | |
|---|---|---|
| JP | 2005158698 A | 6/2005 |
| JP | 2010506400 A | 2/2010 |
| JP | 201672246 A | 5/2016 |
| JP | 2017-49568 A | 3/2017 |
| JP | 2017116904 A | 6/2017 |
| WO | 2010137342 A1 | 12/2010 |
| WO | 2016117636 A1 | 7/2016 |

* cited by examiner

*Primary Examiner* — Changhyun Yi
(74) *Attorney, Agent, or Firm* — Hauptman Ham, LLP

(57) ABSTRACT

A display unit includes a substrate that includes an organic insulating material and a plurality of micro conductors dispersed in the organic insulating material; a semiconductor element provided on the substrate; and a display element layer that is provided on a side opposite to the substrate with respect to the semiconductor element. The display element layer includes a display surface and a plurality of display element that is driven to perform image displaying on the display surface by the semiconductor element.

16 Claims, 9 Drawing Sheets

SEMICONDUCTOR DEVICE AND DISPLAY UNIT

CROSS REFERENCE TO RELATED APPLICATIONS

This application claims the benefit of Japanese Priority Patent Application No. 2018-001909 filed on Jan. 10, 2018, the entire contents of which are incorporated herein by reference.

BACKGROUND

The technology relates to a semiconductor device including a semiconductor element provided on a substrate, and a display unit including the semiconductor device.

In recent years, a semiconductor element, such as a thin-film transistor (TFT), has found its application in a variety of electronic apparatuses. The semiconductor element is provided on a substrate, for example. Reference is made to Japanese Unexamined Patent Application Publication No. 2017-49568, for example.

SUMMARY

It is desirable that a semiconductor device includes a substrate and a semiconductor element, such as a thin-film transistor, to suppress a characteristic deterioration of the semiconductor element.

It is desirable to provide a semiconductor device that makes it possible to suppress a characteristic deterioration of a semiconductor element, and a display unit that includes the semiconductor device.

A semiconductor device according to one embodiment of the technology includes: a substrate that includes an organic insulating material and a plurality of micro conductors dispersed in the organic insulating material; and a semiconductor element provided on the substrate.

A display unit according to one embodiment of the technology includes: a substrate that includes an organic insulating material and a plurality of micro conductors dispersed in the organic insulating material; a semiconductor element provided on the substrate; and a display element layer that is provided on the semiconductor element, and includes a plurality of pixels.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
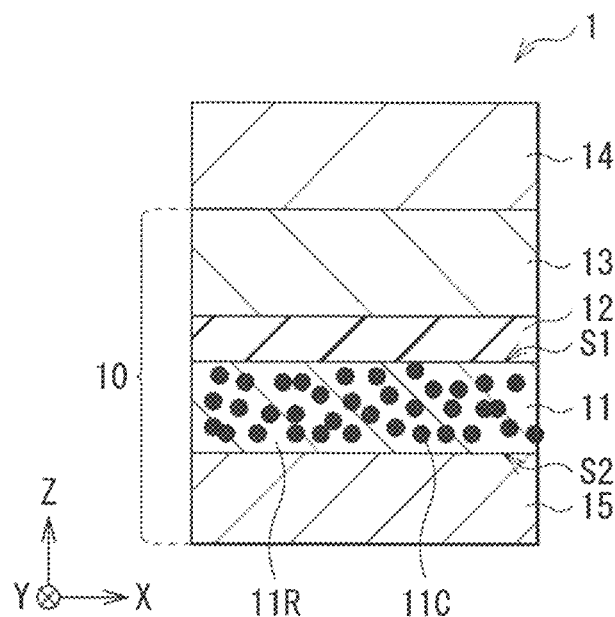
FIG. 1 is a schematic cross-sectional view of of a display unit having an example configuration according to one embodiment of the technology.

In the following, some example embodiments of the disclosure are described in detail, in the following order, with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. Embodiments (Example Display Unit that Includes Substrate Having Micro Conductors)
2. Modification Example 1 (Example Display Unit that Includes Micro Conductors Densely Aggregated Adjacent to One Surface of Substrate)
3. Modification Example 2 (Example Display Unit that Includes Multilayer Substrate)
4. Modification Example 3 (Example Display Unit that Includes Micro Conductors in Wiring-to-wiring Region)
5. Example Operation of Display Unit
6. Example Imaging Unit
7. Example Electronic Apparatus

EMBODIMENTS

[Configuration]

FIG. 1 is a schematic cross-sectional view of a display unit 1 according to an example embodiment of the technology. The display unit 1 may be an organic electroluminescent (EL) unit that includes a semiconductor device 10 and a display element layer 14 provided on the semiconductor device 10.

Figure 2:
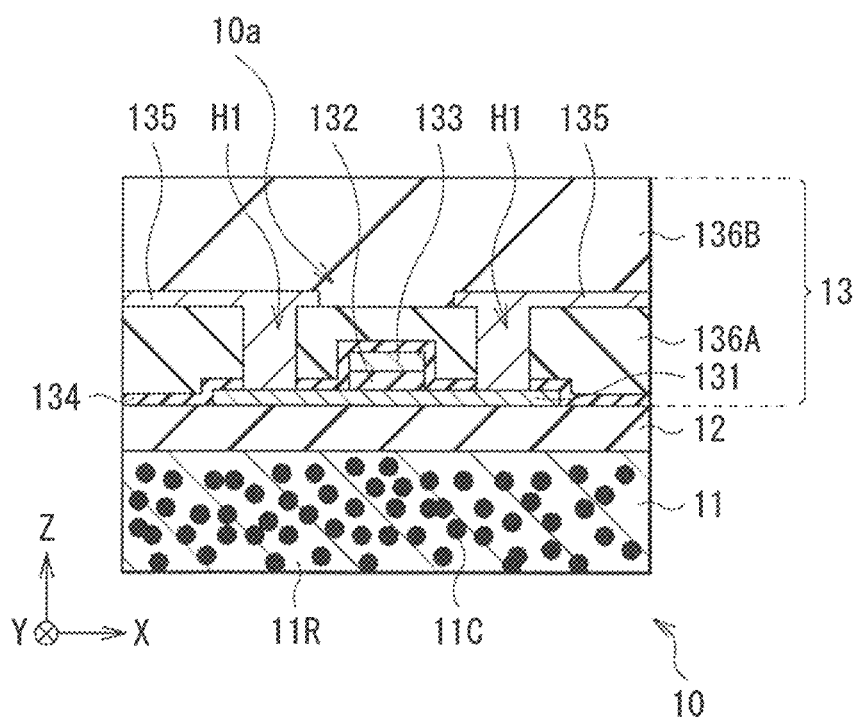
FIG. 2 is a cross-sectional view of a semiconductor device illustrated in FIG. 1.

FIG. 2 illustrates an example configuration of the semiconductor device 10. The semiconductor device 10 may include, for example but not limited to, an insulating film 12 and a TFT layer 13, in this order, on a front surface S1 of a substrate 11. The TFT layer 13 may include a TFT 10a. A metal thin-film 15 may be provided on a rear surface S2 of the substrate 11, as illustrated in FIG. 1. The rear surface S2 may face the front surface S1.

The substrate 11 may be, for example but not limited to, a flexible substrate (i.e., a substrate having flexibility). The substrate 11 may have a thickness in a range from 20 μm to 40 μm along a Z-axis of FIGS. 1 and 2, for example. In this example embodiment, the substrate 11 includes an organic insulating material 11R containing a plurality of micro conductors 11C. Although described in detail below, this makes it possible to shield against an electric field to be applied through the substrate 11 to the TFT 10a in the TFT layer 13 by a simple way.

The substrate 11 may be mainly configured by the organic insulating material 11R that retains the shape of the substrate 11. Specific but non-limiting examples of the organic insulating material 11R may include a resin material, such as polyethylene terephthalate (PET), polyimide (PI), polycarbonate (PC), polyamide, polyethersulfone (PES), and polyethylene naphthalate (PEN). In an example embodiment of the technology, the organic insulating material 11R may include PI or polyamide. PI and polyamide, which have high thermal resistance, may be resistant to denaturation during a heat process at a temperature in a range from about 300° C. to 500° C. in a manufacturing procedure of the TFT layer 13. This allows for formation of the TFT layer 13 directly on the substrate 11. In another example embodiment where a resin material other than PI and polyamide is used as the organic insulating material 11R, the TFT layer 13 may be formed on another substrate, and thereafter the TFT layer 13 may be transferred on the substrate 11.

In an example embodiment of the technology, the micro conductors 11C are dispersed in the organic insulating material 11R. In alternative example embodiment of the technology, agglomerations of the micro conductors 11C may be dispersed in the organic insulating material 11R. The micro conductors 11C may serve to shield against an electric field generated adjacent to the rear surface S2 of the substrate 11 due to static electricity, for example. In an example embodiment of the technology, the substrate 11 that includes the micro conductors 11C may have a surface resistivity of $10^9$ Ω/sq. or less. The use of the substrate 11 having the surface resistivity of $10^9$ Ω/sq. or less sufficiently suppresses influences of the electric field to be imposed on the TFT layer 13 due to the static electricity.

Each of the micro conductors 11C may be a substantially spherical particle having a diameter of 2 μm or smaller. The use of the particles each having the diameter of 2 μm or smaller maintains flatness of the substrate 11. The micro conductors 11C may include, for example but not limited to, an electrically-conductive metal oxide, such as indium tin oxide (ITO), zinc oxide (ZnO), or doped zinc oxide. Alternatively, the micro conductors 11C may include a metal-based material other than metal oxides, or may include an electrically-conductive carbon-based material, for example. The micro conductors 11C may have any shape other than the particle shape, and may have a wire-like or tubular shape, for example.

The substrate 11 that includes the micro conductors 11C may be coupled to a ground (GND) potential through the metal thin-film 15 or a non-illustrated housing.

The insulating film 12 may extend over the entire front surface S1 of the substrate 11, for example. The insulating film 12 may include, for example but not limited to, an inorganic insulating material. The insulating film 12 may be a single-layer film or a multilayer film that includes one or more of silicon oxide ($SiO_x$), silicon nitride (SiN), silicon nitride oxide (SiON), and phosphorus (P)-doped SiO, for example. The insulating film 12 may include aluminum oxide ($Al_2O_3$). The insulating film 12 may have a thickness in a range from 200 nm to 1000 nm, for example. The insulating film 12 may be in contact with a bottom surface of a semiconductor layer 131 (described below) in the TFT layer 13, forming an appropriate interface between the insulating film 12 and the semiconductor layer 131. Optionally, a non-illustrated organic insulating film may be provided between the substrate 11 and the insulating film 12 that includes an inorganic insulating material.

The TFT 10a in the TFT layer 13 may be a top-gate thin-film transistor, for example, and may have a semiconductor layer 131, which is provided in a selective region of the insulating film 12. A gate insulating film 132 may be provided on the semiconductor layer 131, and a gate electrode 133 may be provided on the gate insulating film 132. The semiconductor layer 131, the gate insulating film 132, and the gate electrode 133 may be covered with a protective film 134 and an interlayer insulating film 136A. The protective film 134 and the interlayer insulating film 136A may have contact holes H1 each opposed to a portion of the semiconductor layer 131. A source-drain electrode 135 may be provided on the interlayer insulating film 136A so as to fill the contact holes H1. The interlayer insulating film 136A and the source-drain electrode 135 may be covered with an interlayer insulating film 136B. The TFT 10a may correspond to a specific but non-limiting example of "semiconductor element" according to one embodiment of the technology.

The semiconductor layer 131 may be a patterned on the insulating film 12. The semiconductor layer 131 may include a channel region (i.e., an active layer) opposed to the gate electrode 133. The semiconductor layer 131 may include an oxide semiconductor that includes, as a main component, an oxide of one or more elements of indium (In), gallium (Ga), zinc (Zn), tin (Sn), titanium (Ti), and niobium (Nb) without limitation. Specific but non-limiting examples of the oxide semiconductor may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO). Alternatively, the semiconductor layer may include, for example but not limited to, a low temperature polycrystalline silicon (LTPS) or an amorphous silicon (a-Si).

For example, the gate insulating film 132 may be a single-layer film that includes one of silicon oxide ($SiO_x$), silicon nitride ($SiN_x$), silicon oxide nitride (SiON), and aluminum oxide ($AlO_x$) without limitation, or may be a multilayer film that includes two or more thereof.

The gate electrode 133 may control the carrier density of the semiconductor layer 131 by a gate voltage (Vg) applied thereto, and may serve as a wiring line for supplying a potential. The gate electrode 133 may include, for example but not limited to, a metal containing one of titanium (Ti), tungsten (W), tantalum (Ta), aluminum (Al), molybdenum (Mo), silver (Ag), neodymium (Nd), and copper (Cu), or an alloy thereof. Alternatively, the gate electrode 133 may be a compound containing one or more of these elements, or may be a multilayer film containing two or more of these elements. Still alternatively, the gate electrode 133 may include a transparent electrically-conductive film, such as ITO.

The protective film 134 may include, for example but not limited to, titanium oxide, aluminum oxide, indium oxide, or tin oxide, and may serve as a moisture barrier film or a hydrogen barrier film.

The interlayer insulating films 136A and 136B may include, for example but not limited to, an organic material, such as acrylic resin, polyimide (PI), or novolac-based resin. Alternatively, the interlayer insulating film 136A may include an inorganic material, such as silicon oxide, silicon nitride, silicon oxide nitride, or aluminum oxide.

The source-drain electrode 135 may serve as a source or a drain of the TFT 10a. For example, the source-drain electrode 135 may include a similar or the same metal or transparent electrically-conductive film as those of the gate electrode 133 described above. In an example embodiment of the technology, the source-drain electrode 135 may include a material having a high electrical conductivity.

The display element layer 14 may include a plurality of pixels (e.g., pixels PXL illustrated in FIG. 3, which is described below) and a display element that is driven to perform displaying by a backplane provided with the TFTs 10a. The display element may be, for example but not limited to, an organic electroluminescent element. The organic electroluminescent element may include, for example but not limited to, an anode electrode, an organic electroluminescent layer, and a cathode electrode, in this order from a position adjacent to the TFT layer 13. The anode electrode may be coupled to the source-drain electrode 135 of the TFT 10a. The cathode electrode may be supplied with a cathode potential that is common to the pixels through a wiring line WL2 described below, for example.

In an example embodiment where the substrate 11 is a flexible substrate that includes an organic material, the metal thin-film 15 may be attached to the rear surface S2 of the substrate 11 for the purpose of protection and reinforcement of the substrate 11. In another example embodiment of the technology, the display unit 1 may include no metal thin-film 15. In still another example embodiment of the technology, in place of the metal thin-film 15, a non-illustrated resin film may be attached to the rear surface S2 of the substrate 11. The resin film may include, for example but not limited to, polyimide resin, acrylic resin, styrene resin, polycarbonate resin, epoxy resin, polyethylene, polyester, or silicone resin.

Figure 3:
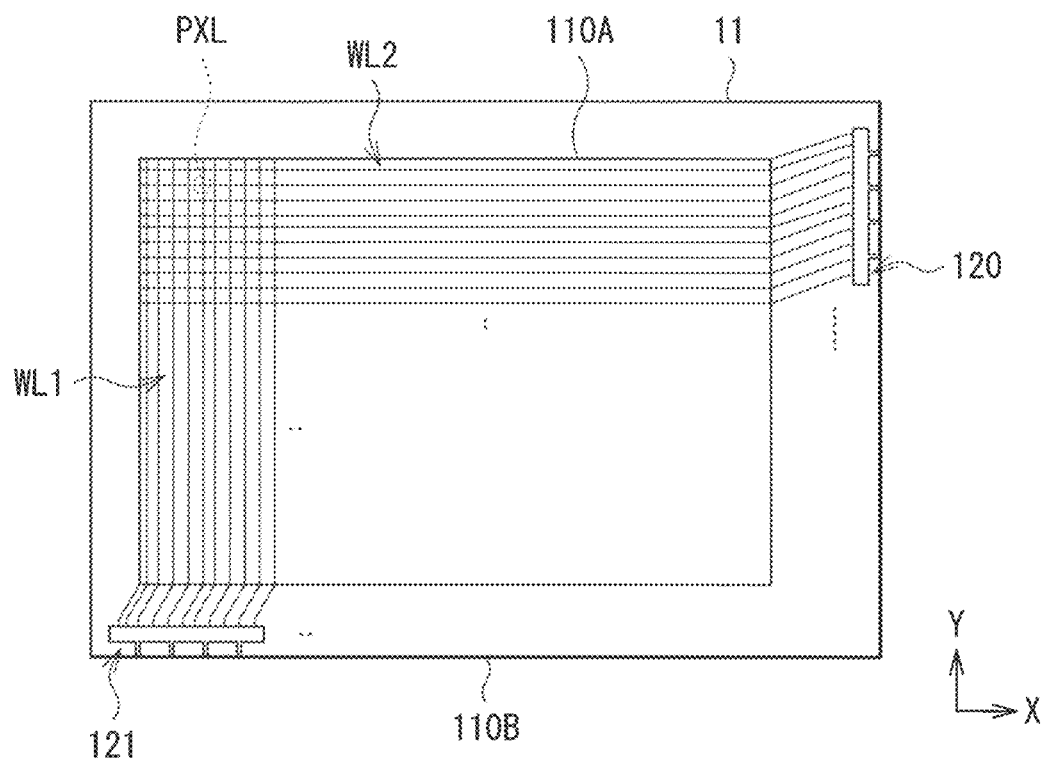
FIG. 3 is a schematic plan view of the display unit illustrated in FIG. 1 having an example wiring configuration.

FIG. 3 is a schematic plan view of the display unit 1 having an example wiring configuration or backplane configuration.

Wiring lines WL1 may extend over a display region 110A of the substrate 11 along a Y-axis. Wiring lines WL2 may extend over the display region 110A of the substrate 11 along an X-axis. Terminals 120 and 121 may be disposed in a peripheral region 110B surrounding the display region 110A. The terminals 120 and 121 may supply a potential to the wiring lines WL2 and WL1, respectively.

Figure 11A:
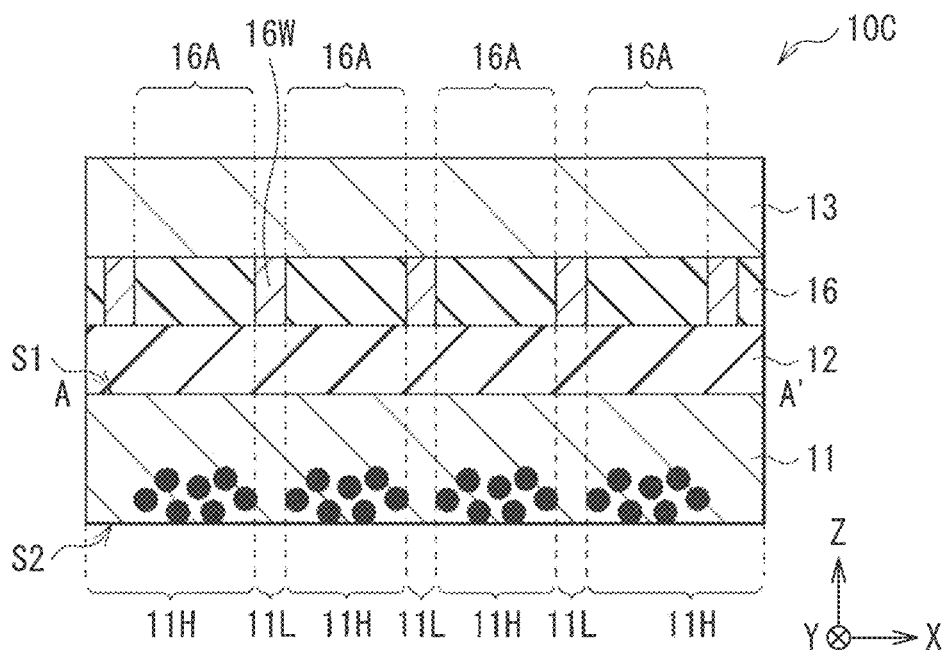
FIG. 11A is a schematic cross-sectional view of a semiconductor device having an example configuration according to Modification Example 3.
Figure 11B:
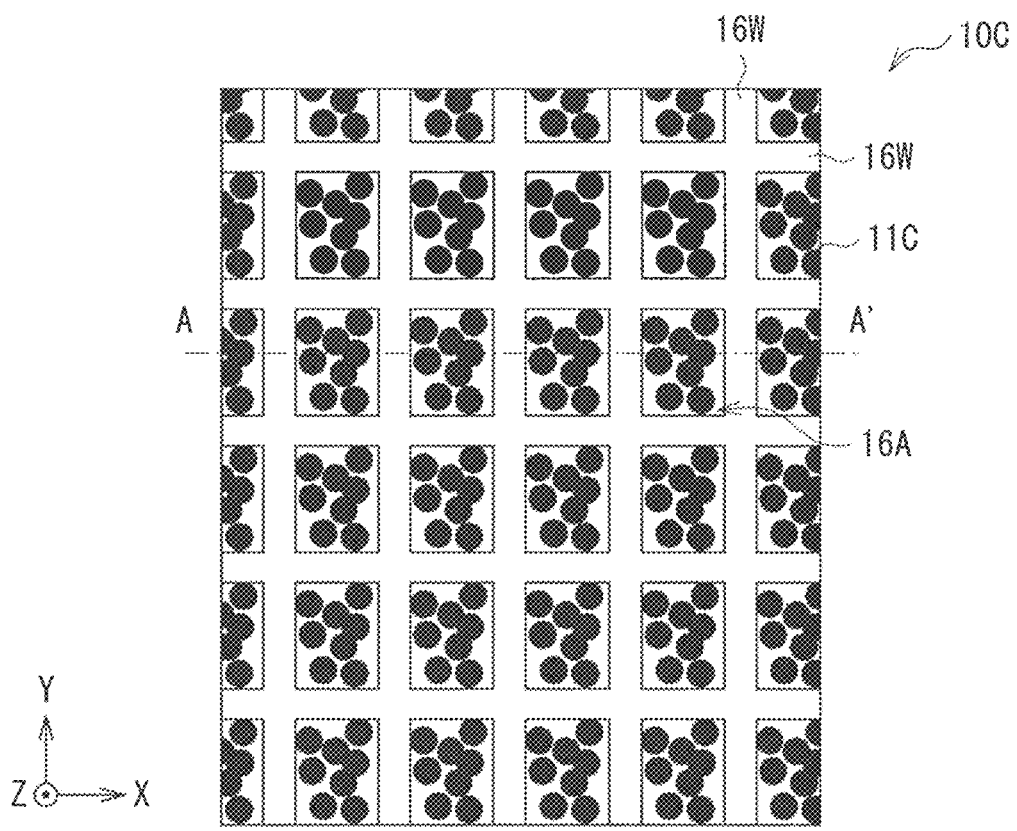
FIG. 11B is a schematic plan view of a substrate and a wiring layer that are illustrated in FIG. 11A.

The wiring lines WL1 and WL2 may each serve as any of a signal line, a scanning line, a power line, and a common potential line. A portion surrounding an intersection between each of the wiring lines WL1 and corresponding one of the wiring lines WL2 may correspond to a single pixel PXL. The wiring lines WL1 and WL2 may extend over the display region 110A and to the peripheral region 110B, and may be respectively coupled to the terminals 121 and 120 in the peripheral region 110B. The wiring lines WL2 may include a common potential line (cathode line), for example, and may be coupled to the terminal 120 in the peripheral region 110B. The wiring lines WL1 may include wiring lines 16W that are illustrated in FIGS. 11A and 11B described below, for example. One wiring line WL11 may serve as a power line, and another wiring line WL12 may serve as a signal line.

The terminals 121 and 120 may supply a potential to the respective wiring lines WL1 and WL2, and may be coupled to a non-illustrated power source. The terminal 120 may include a terminal section that supplies a fixed potential, such as a cathode potential. In this example embodiment, the terminals 120 and 121 may be respectively disposed along two sides of the substrate 11 having a rectangular shape; however, in another example embodiment, the terminals 120 and 121 may be disposed along one side of the substrate 11 or three or four sides of the substrate.

Although illustration of the TFTs 10a is omitted in FIG. 3, one of the TFTs 10a may be provided for each pixel PXL in this example embodiment. Note that any number of the TFTs 10a may be provided for each pixel PXL. In another example embodiment, two of the TFTs 10a may be provided for each pixel PXL.

[Manufacturing Method]

Figure 4A:
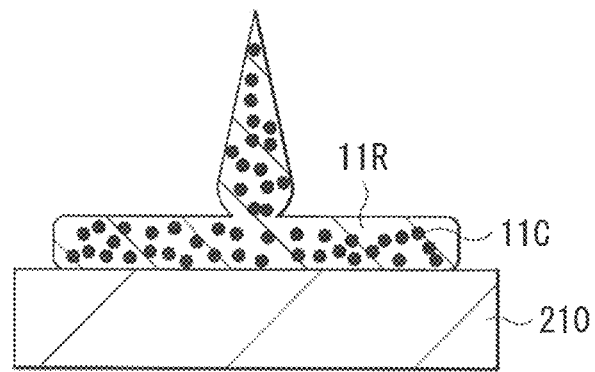
FIG. 4A is a schematic cross-sectional diagram illustrating an example process in a method of manufacturing the display unit 1 illustrated in FIG. 1.
Figure 4B:
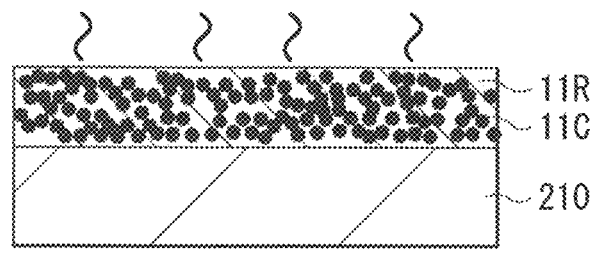
FIG. 4B is a schematic cross-sectional diagram illustrating an example process following the process of FIG. 4A.
Figure 4C:
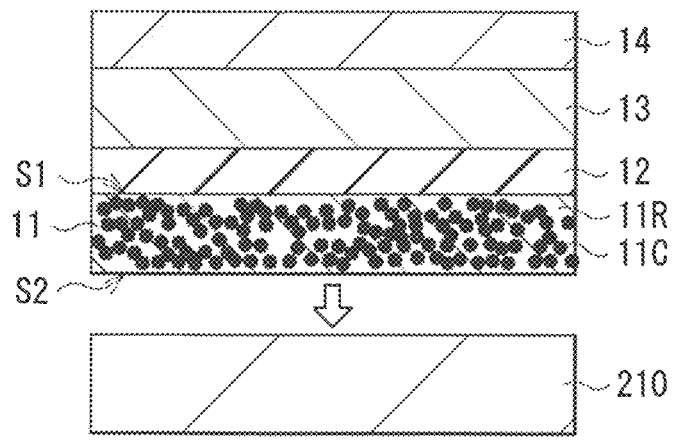
FIG. 4C is a schematic cross-sectional diagram illustrating an example process following the process of FIG. 4B.

A method of manufacturing the display unit 1 according to an example embodiment of the technology will now be described. FIGS. 4A to 4C illustrate processes of manufacturing the display unit 1 in sequence.

Firstly, a support substrate 210 that includes glass, for example, may be prepared. Thereafter, with reference to FIG. 4A, a varnish that includes the organic insulating material 11R and the micro conductors 11C may be applied on the support substrate 210. The application may be performed by slit coating or spin coating, for example.

Thereafter, with reference to FIG. 4B, the varnish applied on the support substrate 210 may be subjected to a curing treatment. The curing treatment may involve a drying process and a firing process. The drying process may be performed under reduced pressure, for example. The firing process may be performed at a temperature of 400° C. or higher. Through the curing treatment, the substrate 11 that includes the micro conductors 11C may be formed on the support substrate 210.

After forming the substrate 11 that includes the micro conductors 11C on the support substrate 210, the insulating film 12, the TFT layer 13, and the display element layer 14 may be formed, in this order, on the front surface S1 of the substrate 11. For example, these layers may be formed as follows.

Firstly, the insulating film 12 that includes an inorganic insulating material may be formed on the surface S1 of the substrate 11 by chemical vapor deposition (CVD), for example. Thereafter, the TFT layer 13 may be formed. In this example embodiment, the TFT 10a illustrated in FIG. 2 may be formed. In one example, the semiconductor layer 131 that includes any of the material described above (e.g., an oxide semiconductor) may be formed on the insulating film 12 by sputtering, for example, and may be patterned into a predetermined shape by photolithography or etching, for example. Thereafter, the gate insulating film 132 that includes any of the material described above may be formed by CVD, for example. Thereafter, the gate electrode 133 that includes any of the material described above may be patterned on the gate insulating film 132, and the gate insulating film 132 may be patterned by etching with the use of the gate electrode 133 as a mask. Thereafter, the protective film 134 and the interlayer insulating film 136A may be formed, and the contact hole H1 may be formed in a region opposed to a portion of the semiconductor layer 131. Thereafter, the source-drain electrode 135 that includes any of the metal material described above may be formed on the interlayer insulating film 136A so as to fill the contact hole H1. The TFT 10a may be thereby formed. Thereafter, the interlayer insulating film 136B may be formed so as to cover the source-drain electrode 135.

Thereafter, the display element layer 14 may be formed on the TFT layer 13. In an example embodiment where the display element layer 14 includes an organic electroluminescent element, the display element layer 14 that includes the anode electrode, the organic electroluminescent layer, and the cathode electrode may be formed on the TFT layer 13.

After the formation of the display element layer 14 described above, the support substrate 210 may be removed from the rear surface S2 of the substrate 11, with reference to FIG. 4C. The support substrate 210 may be removed by so-called laser lift-off (LLO), which involves irradiation of a rear surface of the support substrate 210 with laser light L. Finally, the metal thin-film 15 may be formed on the rear surface S2 of the substrate 11, to produce the display unit 1 illustrated in FIG. 1.

Workings and Example Effects

In the display unit 1 according to any foregoing example embodiment of the technology, each pixel in the display element layer 14 may be driven to perform image displaying on the basis of an external image signal. For example, the TFT 10a in the TFT layer 13 of the semiconductor device 10 may be driven per pixel by a voltage, for example. In one example, upon application of a voltage equal to or greater than a threshold voltage to the gate electrode 133 of the TFT 10a, the semiconductor layer 131 described above may be activated (i.e., a channel may be formed) to cause an electric current to flow between a pair of the source-drain electrodes 135.

In the semiconductor device 10 according to any foregoing example embodiment of the technology, the substrate 11 includes the micro conductors 11C. Accordingly, it is possible to shield against an electric field to be applied to the TFT 10a through the substrate 11 by a simple way. The workings and example effects will now be described.

Static electricity is likely to be generated on a rear surface of a flexible substrate. The static electricity can cause an electric field which can impose influences on a characteristic of a TFT through the substrate. A possible measure for suppressing the influences of the electric field may be to provide an electric-field shielding layer (e.g., an electric-field shielding layer 102 illustrated in FIGS. 5 and 6 described below) between the substrate and the TFT.

Figure 5:
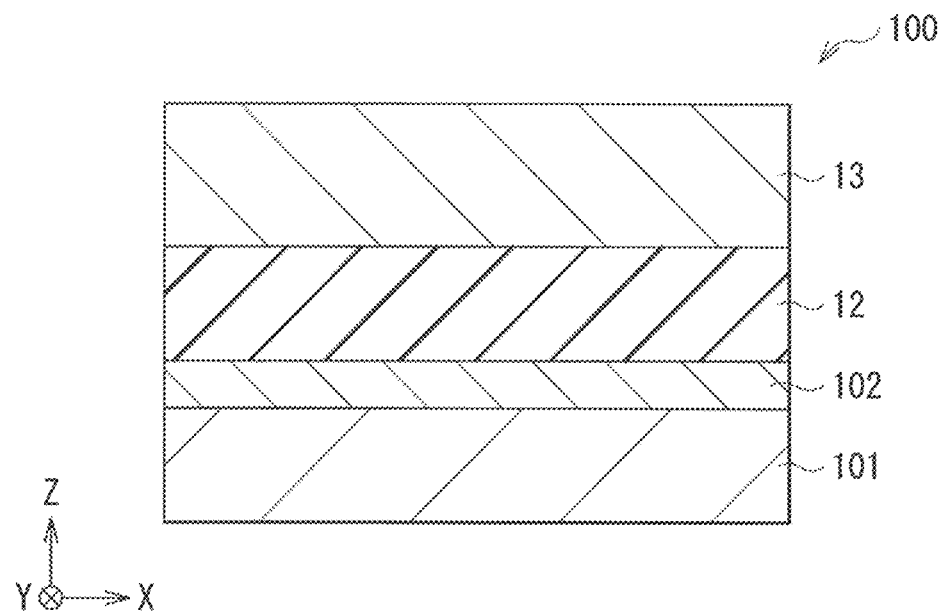
FIG. 5 is a schematic cross-sectional view of a semiconductor device having an example configuration that includes an electric-field shielding layer.

FIG. 5 schematically illustrates a cross-sectional configuration of a semiconductor device 100 that includes the electric-field shielding layer 102. The semiconductor device 100 includes the electric-field shielding layer 102, the insulating film 12, and the TFT layer 13, in this order, on a substrate 101. The substrate 101 of the semiconductor device 100 includes an organic insulating material and no micro conductor (i.e., the micro conductors 11C of FIG. 1). The electric-field shielding layer 102 is an electrically-conductive metal film, for example. The electric-field shielding layer 102 is a metal film formed by sputtering, for example, on the substrate 101 fixed to a support substrate.

Figure 6:
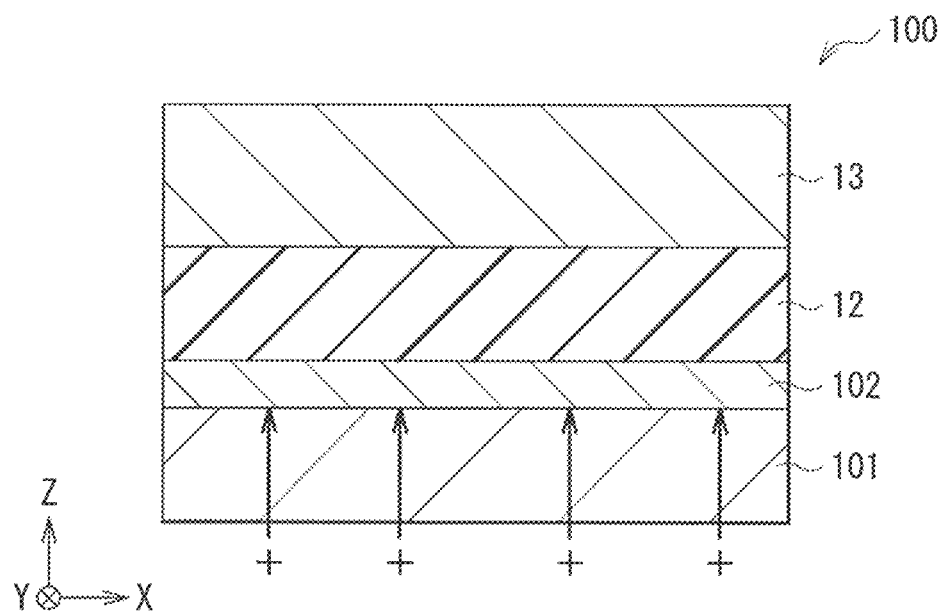
FIG. 6 is a schematic cross-sectional view of the semiconductor device illustrating an example property of the electric-field shielding layer illustrated in FIG. 5.

With reference to FIG. 6, in the semiconductor device 100, an electric field caused by electric charges (+) generated on the rear surface of the the substrate 101 are blocked by the electric-field shielding layer 102. This can suppress changes in the characteristics of the TFT layer 13 due to the electric field. However, the semiconductor device 100 that includes the electric-field shielding layer 102 formed by sputtering, for example, can require increased manufacturing costs due to a material cost and increased number of processes for the electric-field shielding layer 102. This can reduce productivity of the semiconductor device 100.

Figure 7:
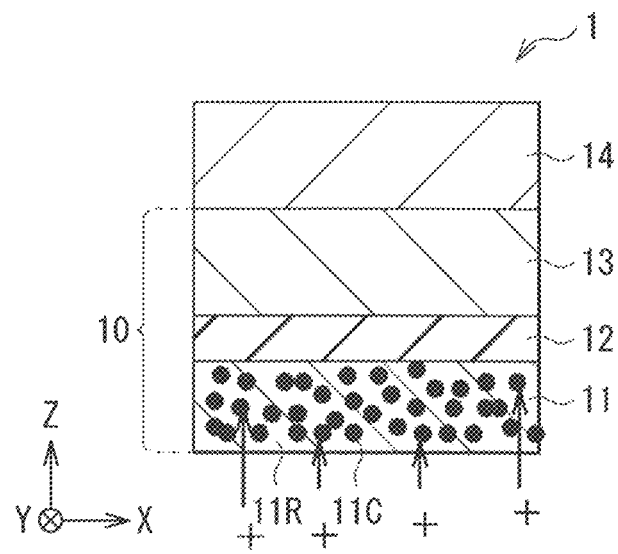
FIG. 7 is a schematic cross-sectional view of the display unit illustrating example workings of micro conductors illustrated in FIG. 1.

In contrast, with reference to FIG. 7, the semiconductor device 10 includes the substrate 11 that includes the micro conductors 11C, in place of the electric-field shielding layer 102 illustrated in FIGS. 5 and 6. The micro conductors 11C shields against the electric field applied to the TFT 10a through the substrate 11. Accordingly, it is possible to suppress a characteristic deterioration of the TFT 10a due to the electric field. Additionally, the substrate 11 that includes the micro conductors 11C is formed by the simple way as described above. This reduces the manufacturing costs, and thus improves productivity thereof, compared with the semiconductor device 100.

The semiconductor device 10 according to any foregoing example embodiment of the technology includes the substrate 11 that includes the micro conductors 11C. This makes it possible to shield against the electric field to be applied to the TFT 10a through the substrate 11 by a simple way.

As described above, according to any foregoing example embodiment of the technology, the substrate 11 includes the micro conductors 11C. This suppresses influences of an electric field to be imposed on the TFT 10a through the substrate 11. Accordingly, it is possible to suppress a characteristic deterioration of the TFT 10a.

Some modification examples of the technology will now be described. In the following description, elements or components identical to those in the foregoing example embodiment are denoted with the same reference numerals without any redundant description.

Modification Example 1

Figure 8:
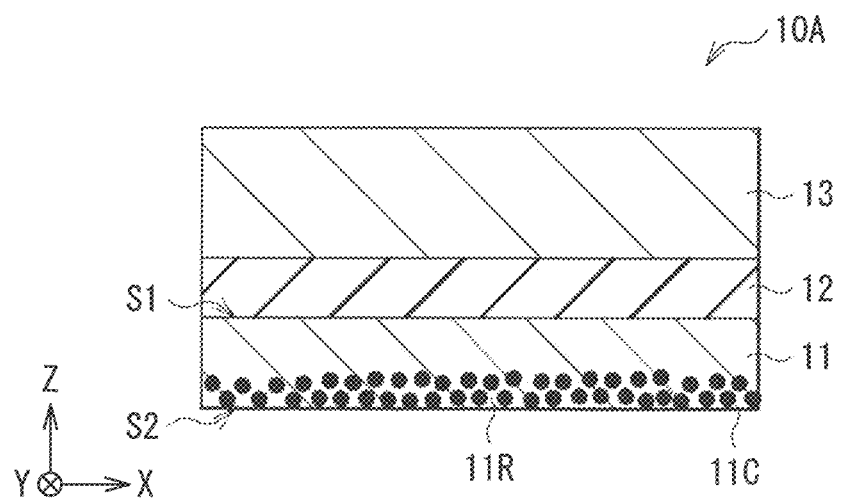
FIG. 8 is a schematic cross-sectional view of a semiconductor device having an example configuration according to Modification Example 1.

FIG. 8 schematically illustrates a cross-sectional configuration of a semiconductor device 10A according to Modification Example 1 of the foregoing example embodiment of the technology. In the semiconductor device 10A, the micro conductors 11C may be aggregated adjacent to the rear surface S2 of the substrate 11. Except this configuration, the semiconductor device 10A may have a similar configuration to the semiconductor device 10 of the foregoing example embodiment. The workings and example effects of the semiconductor device 10A of Modification Example 1 may also be similar to those of the semiconductor device 10 of the foregoing example embodiment.

The density of the micro conductors 11C may be low in an internal portion adjacent to the front surface S1 of the substrate 11. In contrast, the density of the micro conductors 11C may be higher in an internal portion adjacent to the rear surface S2 of the substrate 11 than that in the internal portion adjacent to the front surface S1 of the substrate 11. Additionally, the micro conductors 11C may be distributed over the internal portion adjacent to the rear surface S2 of the substrate 11. In other words, the micro conductors 11C may be densely aggregated adjacent to the rear surface S2 of the substrate 11. Such micro conductors 11C most of which are distributed adjacent to the rear surface S2 of the substrate 11 are less likely to impose influences on the TFT layer 13 than the micro conductors 11C that are distributed substantially uniformly along a thickness direction of the substrate 11 is. This reduces parasitic capacitance and a back-channel effect between the substrate 11 and the TFT layer 13, for example.

The substrate 11 in which the micro conductors 11C are densely aggregated adjacent to the rear surface S2 may be manufactured as follows. In an example embodiment, a varnish that includes the organic insulating material 11R and the micro conductors 11C may be applied on the support substrate 210, as illustrated in FIG. 4A. Thereafter, the micro conductors 11C may be precipitated by being left to stand for a while. Thereafter, a curing process may be performed, as illustrated in FIG. 4B, to produce the substrate 11 in which the micro conductors 11C are densely aggregated adjacent to the rear surface S2. In an alternative embodiment, magnets and the micro conductors 11C having a magnetic property may be prepared. The magnets may be disposed adjacent to the support substrate 210 to draw most of the micro conductors 11C to the vicinity of the rear surface S2.

Like the semiconductor device 10, the semiconductor device 10A includes the substrate 11 that includes the micro conductors 11C. This suppresses influences of an electric field to be imposed on the TFT 10a through the substrate 11. Further, the micro conductors 11C may be densely aggregated adjacent to the rear surface S2, and the density of the micro conductors 11C may thus be high adjacent to the rear surface S2, whereas the density of the micro conductors 11C may be low adjacent to the front surface S1. This reduces influence of the micro conductors 11C to be imposed on the TFT layer 13.

Modification Example 2

Figure 9:
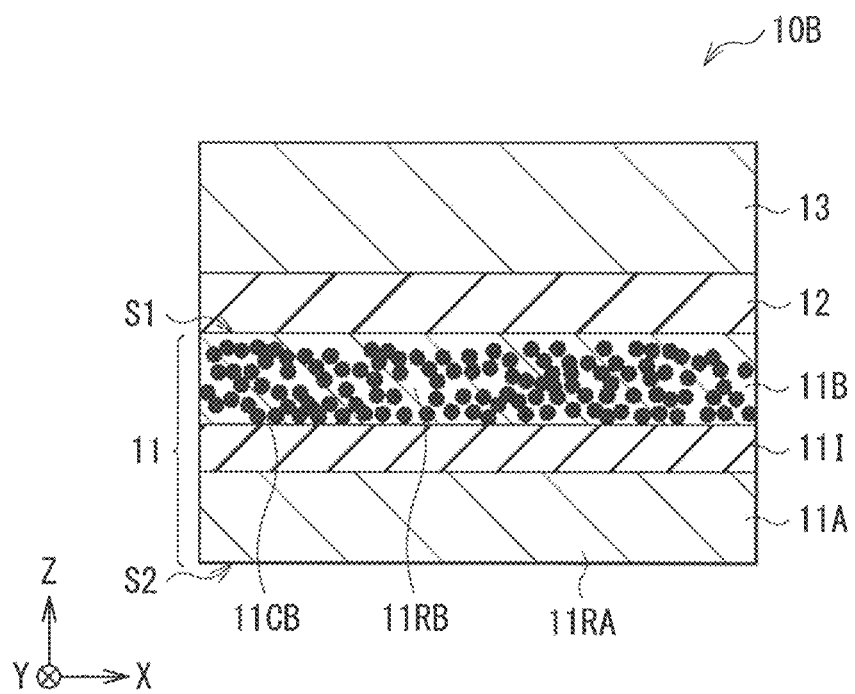
FIG. 9 is a schematic cross-sectional view of a semiconductor device having an example configuration according to Modification Example 2.

FIG. 9 schematically illustrates a cross-sectional configuration of a semiconductor device 10B according to Modification Example 2 of the foregoing example embodiment of the technology. The substrate 11 of the semiconductor device 10B may be a laminate that includes a first layer 11A and a second layer 11B. Except the configuration, the semiconductor device 10B may have a similar configuration to the semiconductor device 10 of the foregoing example embodiment. The workings and example effects of the semiconductor device 10B of Modification Example 2 may also be similar to those of the semiconductor device 10 of the foregoing example embodiment.

The substrate 11 may include the first layer 11A, an insulating layer 11I, and the second layer 11B, in this order, from a position adjacent to the rear surface S2. In other words, the rear surface S2 of the substrate 11 may be one surface of the first layer 11A, and the front surface S1 of the substrate 11 may be one surface of the second layer 11B.

The first layer 11A may include, for example but not limited to, an organic insulating material 11RA. The first layer 11A may include no micro conductor. The organic insulating material 11RA may be a similar or the same material as the organic insulating material 11R.

The insulating layer 11I provided between the first layer 11A and the second layer 11B may include, for example but not limited to, an inorganic insulating material. The insulating layer 11I may be a single-layer film or a multilayer film that includes one or more of silicon oxide (SiO$_x$), silicon nitride (SiN), silicon nitride oxide (SiON), and phosphorus (P)-doped SiO, for example. The insulating layer 11I may include aluminum oxide aluminum (Al$_2$O$_3$).

The second layer 11B may include, for example but not limited to, an organic insulating material 11RB and micro conductors 11CB. The organic insulating material 11RB may be a similar or the same material as the organic insulating material 11R. The micro conductors 11CB may include a similar or the same material and has a similar or the same shape as the micro conductors 11C. The organic insulating material 11RB may include the same material as the organic insulating material 11RA of the first layer 11A, or may include a different material from the the organic insulating material 11RA of the first layer 11A.

Figure 10:
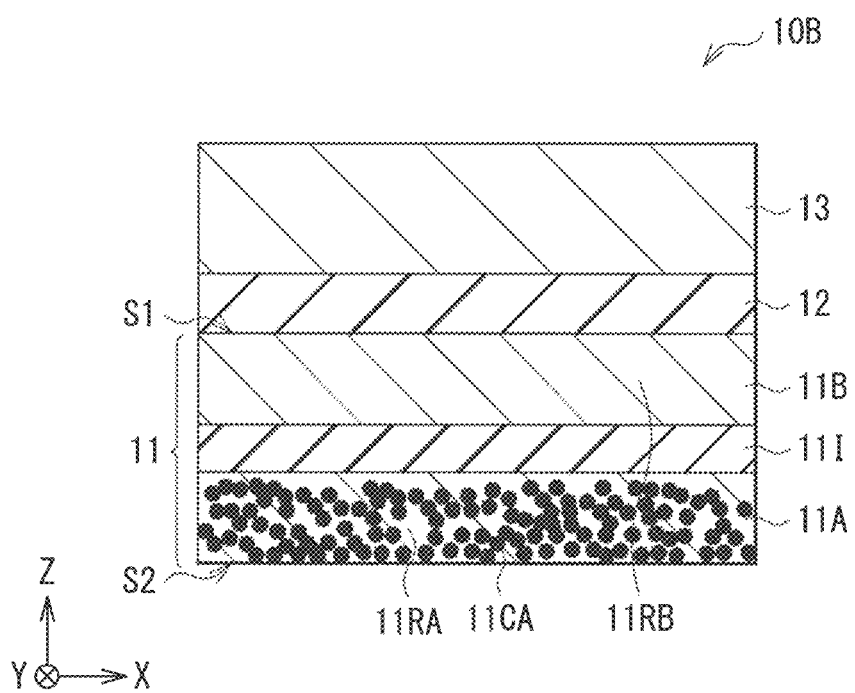
FIG. 10 is a schematic cross-sectional view of another example of the semiconductor device illustrated in FIG. 9.

FIG. 10 schematically illustrates another cross-sectional configuration of the semiconductor device 10B. In this example, the first layer 11A may include the organic insulating material 11RA and the micro conductors 11CA, and the second layer 11B may include no micro conductor. The substrate 11 in which the micro conductors 11CA is included only in the first layer 11A reduces influences of the micro conductors 11CA to be imposed on the TFT layer 13. This reduces parasitic capacitance and a back-channel effect between the substrate 11 and the TFT layer 13, for example.

Alternatively, the first layer 11A and the second layer 11B may respectively include the organic insulating materials 11RA and 11RB, and the micro conductors 11CA and 11CB.

Like the semiconductor device 10, the semiconductor device 10B includes the substrate 11 that includes the micro conductors 11CA or 11CB in one or both of the first layer 11A and the second layer 11B. This suppresses influences of an electric field to be imposed on the TFT 10a through the substrate 11.

Modification Example 3

FIG. 11A schematically illustrates a cross-sectional configuration of a semiconductor device 10C according to Modification Example 3 of the foregoing example embodiment of the technology. The substrate 11 of the semiconductor device 10C may have regions having different densities of the micro conductors 11C, such as high-density regions 11H and low-density regions 11L, along an X-Y plane of FIG. 11A. Except the configuration, the semiconductor device 10C may have a similar configuration to the semiconductor device 10 of the foregoing example embodiment. The workings and example effects of the semiconductor device 10C of Modification Example 3 may also be similar to those of the semiconductor device 10 of the foregoing example embodiment.

The semiconductor device 10C may include, for example but not limited to, the insulating film 12, a wiring layer 16, and the TFT layer 13, in this order, on the front surface S1 of the substrate 11.

FIG. 11B is a schematic plan view of the substrate 11 and the wiring layer 16. Note that, FIG. 11A illustrates a cross-sectional configuration taken along the line A-A' of FIG. 11B. The wiring layer 16 may include a plurality of wiring lines 16W extending along the X-axis and Y-axis of FIG. 11B. A wiring-to-wiring region 16A may be defined between each two adjacent ones of the wiring lines 16W.

The substrate 11 may include the high-density regions 11H having a predetermined density of the micro conductors 11C, and the low-density regions 11L having a density of the micro conductors 11C lower than the predetermined density of the micro conductors 11C in the high-density regions 11H. The high-density regions 11H and the low-density regions 11L may be provided along a plane direction of the substrate 11. For example, the high-density regions 11H may be opposed to the respective wiring-to-wiring regions 16A of the wiring layer 16, and the low-density regions 11L may be opposed to the respective wiring lines 16W of the wiring layer 16. In other words, the micro conductors 11C in the substrate 11 may be provided in regions other than the regions opposed to the wiring lines 16W.

The low-density regions 11L opposed to the respective wiring lines 16W suppress occurrence of parasitic capacitance between the micro conductors 11C and the wiring lines 16W. In an example embodiment, the micro conductors 11C in the high-density regions 11H may be densely aggregated adjacent to the rear surface S2 of the substrate 11. The micro conductors 11C densely aggregated in the high-density regions 11H and adjacent to the rear surface S2 of the substrate 11 suppress the occurrence of the parasitic capacitance between the micro conductors 11C and the wiring lines 16W more effectively.

Figure 12:
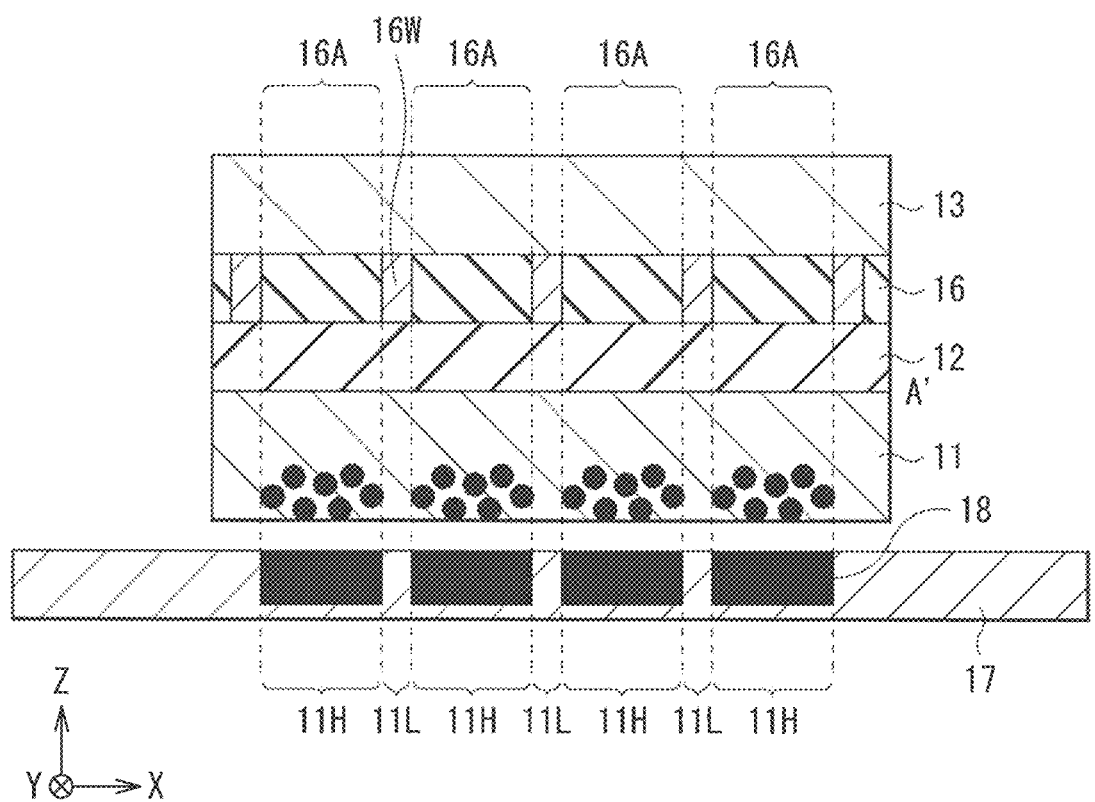
FIG. 12 is a schematic cross-sectional diagram illustrating an example method of manufacturing the substrate illustrated in FIG. 11A.

FIG. 12 illustrates an example method of manufacturing the substrate 11 including the high-density regions 11H and the low-density regions 11L. For example, a stage 17 provided with a plurality of magnets 18 may be prepared. The magnets 18 may be disposed at positions to face the respective wiring-to-wiring regions 16A. The substrate 11 that includes the micro conductors 11C having a magnetic property may be disposed on the stage 17. This draws the micro conductors 11C to the positions facing the magnets 18, to form the high-density regions 11H and the low-density regions 11L.

Like the semiconductor device 10, the semiconductor device 10C includes the substrate 11 that includes the micro conductors 11C. This suppresses influences of an electric field to be imposed on the TFT 10a through the substrate 11. Further, the low-density regions 11L of the substrate 11 may be opposed to the respective wiring lines 16W. This suppresses occurrence of parasitic capacitance between the micro conductors 11C and the wiring lines 16W.

[Example Operation of Display Unit]

Figure 13:
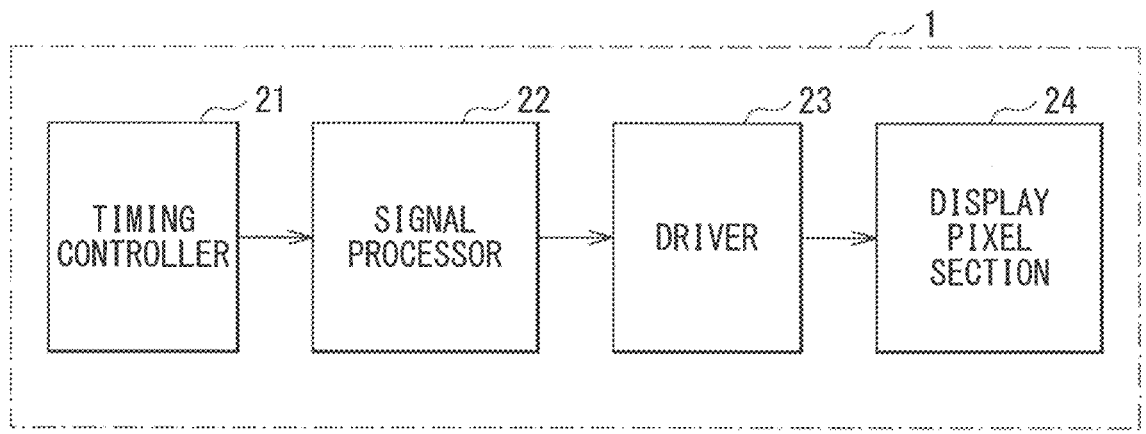
FIG. 13 is a block diagram illustrating a display unit having an example configuration.

FIG. 13 is an example block diagram of the display unit 1 according to any foregoing example embodiment of the technology.

The display unit 1 may display an external image signal or an internal image signal in the form of an image. The display unit 1 may be applied to, for example but not limited to, a liquid crystal display as well as the organic electroluminescent display described above. The display unit 1 may include, for example but not limited to, a timing controller 21, a signal processor 22, a driver 23, and a display pixel section 24.

The timing controller 21 may include a timing generator that generates various timing signals (control signals). The timing controller 21 may control driving of the signal processor 22, for example, on the basis of the various timing signals. The signal processor 22 may perform a predetermined correction of an external digital image signal, and output the corrected image signal to the driver 23, for example. The driver 23 may include, for example but not limited to, a scanning-line driving circuit and a signal-line driving circuit, and may drive pixels in the display pixel section 24 via various control lines. The display pixel section 24 may include, for example but not limited to, a display element (e.g., the display element layer 14 described above) and a pixel circuit that drives the display element on a pixel basis. The display element may be an organic electroluminescent element or a liquid crystal display element, for example. The TFT 10a may be included in any circuit that constitutes a portion of the driver 23 or the display pixel section 24, for example.

[Example Imaging Unit]

Figure 14:
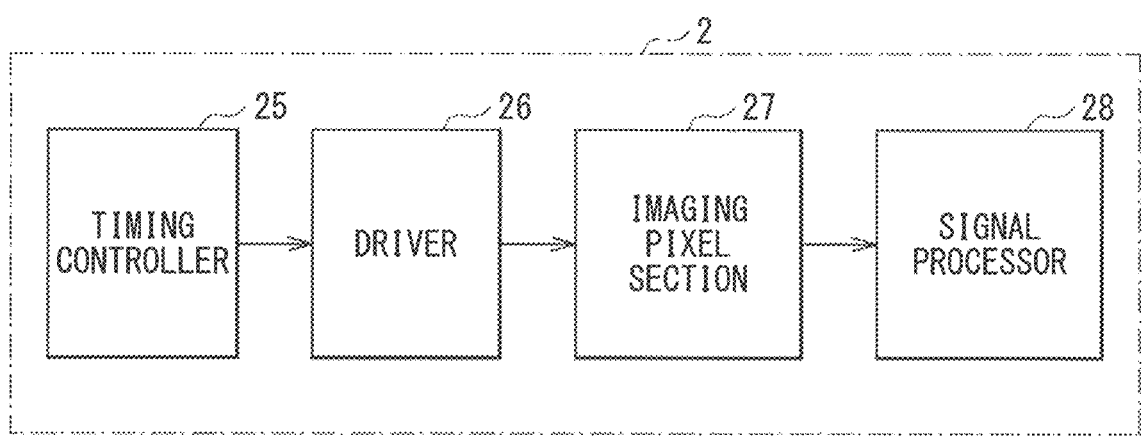
FIG. 14 is a block diagram illustrating an imaging unit having an example configuration.

In the foregoing example embodiments and modification examples of the technology, the semiconductor devices 10, 10A, 10B, and 10C are applied to the display unit 1; however, the semiconductor devices 10, 10A, 10B, and 10C may be applied to other apparatuses, such as an imaging unit 2 illustrated in FIG. 14.

For example, the imaging unit 2 may be a solid-state imaging device that acquires images in the form of electric signal, such as a charge coupled device (CCD) or a complementary metal oxide semiconductor (CMOS) image sensor. The imaging unit 2 may include, for example but not limited to, a timing controller 25, a driver 26, an imaging pixel section 27, and a signal processor 28.

The timing controller 25 may include a timing generator that generates various timing signals (control signals). The timing controller 25 may control driving of the driver 26 on the basis of the various timing signals. The driver 26 may include, for example but not limited to, a row selection circuit, an A/D converter circuit, and a horizontal transfer scanning circuit, and may be driven to read signals from pixels in the imaging pixel section 27 through various control lines. The imaging pixel section 27 may include, for example but not limited to, an imaging element or a photoelectric transducer, such as a photodiode, and a pixel circuit that reads signals. The signal processor 28 may perform various processes on signals received from the imaging pixel section 27. The TFT 10a may be included in any circuit that constitutes a portion of the driver 26 or the imaging pixel section 27, for example.

[Example Electronic Apparatus]

Figure 15:
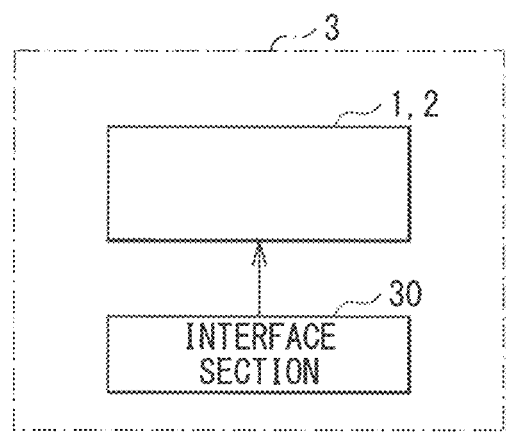
FIG. 15 is a block diagram illustrating an electronic apparatus having an example configuration.

The display unit 1 or the imaging unit 2 described in any foregoing example embodiment and modification example of the technology may be applied to a variety of electronic apparatuses. FIG. 15 is an example block diagram of an electronic apparatus 3. Specific but non-limited examples of the electronic apparatus 3 may include television apparatuses, personal computers (PCs), smartphones, tablet PCs, mobile phones, digital still cameras, digital video cameras, and any other apparatuses having a displaying functionality.

The electronic apparatus 3 may include, for example but not limited to, the display unit 1 or the imaging unit 2, and an interface section 30. The interface section 30 may be an input section that receives various external signals and external electric power. Optionally, the interface section 30 may include, for example, a user interface such as a touch panel, a keyboard, or operation buttons.

Although the technology has been described with reference to the example embodiments and modification examples, the technology is not limited thereto, but may be modified in a wide variety of ways. For example, factors such as a material and a thickness of each layer exemplified in any foregoing example embodiment and modification example are illustrative and non-limiting. Any other material and any other thickness may be adopted besides those described above.

In the foregoing example embodiments and modification examples, the TFT 10a may be of a top-gate type; however, the technology may also be applied to a semiconductor device that includes the TFT 10a of a bottom-gate type.

In Modification Example 1 illustrated in FIG. 8, for example, the density of the micro conductors 11C may be higher in an internal portion adjacent to the rear surface S2 of the substrate 11 than that in an internal portion adjacent to the front surface S1 of the substrate 11. In an alternative example embodiment of the technology, the density of the micro conductors 11C may be higher in the internal portion adjacent to the front surface S1 of the substrate 11 than that in the internal portion adjacent to the rear surface S2 of the substrate 11.

In Modification Example 2 illustrated in FIGS. 9 and 10, for example, the substrate 11 may include the first layer 11A and the second layer 11B. Alternatively, the substrate 11 may include three or more layers that include an organic insulating material.

In the foregoing example embodiments and modification examples, the semiconductor devices 10, 10A, 10B, and 10C may include the TFT 10a (i.e., the TFT layer 13). In another example embodiment of the the technology, the semiconductor device may include a semiconductor element other than the TFT. For example, the semiconductor element other than the TFT may be various types of semiconductor elements that include an electrode, such as a capacitor and a photoelectric transducer.

It should be appreciated that the effects described herein are mere examples. Effects of an example embodiment of the technology are not limited to those described herein. Any embodiment of the technology may further include any effect other than those described herein.

It is possible to achieve at least the following configurations from the above-described example embodiments of the technology.

(1) A semiconductor device including:
  a substrate that includes an organic insulating material and a plurality of micro conductors dispersed in the organic insulating material; and
  a semiconductor element provided on the substrate.

(2) The semiconductor device according to (1), further including an inorganic insulating film between the substrate and the semiconductor element.

(3) The semiconductor device according to (1) or (2), in which the organic insulating material includes polyimide.

(4) The semiconductor device according to any one of (1) to (3), in which the substrate has a surface resistivity of $10^9$ Ω/sq. or less.

(5) The semiconductor device according to any one of (1) to (4), in which each of the micro conductors has a diameter of 2 μm or smaller.

(6) The semiconductor device according to any one of (1) to (5), in which
  the substrate has a first surface over which the semiconductor element is provided, and a second surface that faces the first surface, and
  a density of the micro conductors in an internal portion adjacent to the second surface of the substrate is higher than a density of the micro conductors in an internal portion adjacent to the first surface of the substrate.

(7) The semiconductor device according to any one of (1) to (6), in which
  the substrate includes a laminate of a first layer and a second layer, and
  the micro conductors are included in one or both of the first layer and the second layer.

(8) The semiconductor device according to (7), further including an insulating layer between the first layer and the second layer.

(9) The semiconductor device according to any one of (1) to (8), in which the substrate has a high-density region having a predetermined a density of the micro conductors, and a low-density region having a density of the micro conductors lower than the predetermined density of the micro conductors in the high-density region.

(10) The semiconductor device according to (9), further including a wiring line that is provided on the substrate and is opposed to the low-density region, out of the high-density region and the low-density region.

(11) The semiconductor device according to any one of (1) to (10), in which the substrate is coupled to a ground potential.

(12) The semiconductor device according to any one of (1) to (11), in which the semiconductor element includes a thin-film transistor.

(13) The semiconductor device according to any one of (1) to (12), in which the substrate includes a flexible substrate.

(14) The semiconductor device according to any one of (1) to (13), in which the micro conductors include metal or carbon.

(15) A display unit including:
  a substrate that includes an organic insulating material and a plurality of micro conductors dispersed in the organic insulating material;
  a semiconductor element provided on the substrate; and
  a display element layer that is provided on the semiconductor element, and having a plurality of pixels.

The semiconductor device and the display unit according to any example embodiment of the technology includes the substrate that includes the micro conductors. This shields against an electric field applied to the semiconductor element through the substrate.

The semiconductor device and the display unit according to any example embodiment of the technology includes the substrate that includes the micro conductors. This suppresses influences of an electric field to be imposed on the semiconductor element through the substrate. Accordingly, it is possible to suppress a characteristic deterioration of the semiconductor element. Note that effects of the technology are not limited to those described above, and may be any effect described herein.

Although the technology has been described in terms of example embodiments and modification examples, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this technology is intended to be dedicated to the public regardless of whether the element or component is explicitly recited in the following claims.

What is claimed is:
1. A display unit comprising:
  a substrate that includes an organic insulating material and a plurality of micro conductors dispersed in the organic insulating material;
  a semiconductor element provided on the substrate; and
  a display element layer that is provided on a side opposite to the substrate with respect to the semiconductor element, and includes a display surface and a plurality of display element that is driven to perform image displaying on the display surface by the semiconductor element wherein the substrate has a first surface on which the semiconductor element is provided, and a second surface that faces the first surface, and a density of the micro conductors in an internal portion adjacent to the second surface of the substrate is higher than a density of the micro conductors in an internal portion adjacent to the first surface of the substrate.

2. An imaging unit comprising:

a substrate that includes an organic insulating material and a plurality of micro conductors dispersed in the organic insulating material;

a semiconductor element provided on the substrate; and an imaging element layer that is provided on a side opposite to the substrate with respect to the semiconductor element, and includes a plurality of imaging element that is driven to read signals from the imaging element by the semiconductor element, wherein the substrate has a first surface on which the semiconductor element is provided, and a second surface that faces the first surface, and a density of the micro conductors in an internal portion adjacent to the second surface of the substrate is higher than a density of the micro conductors in an internal portion adjacent to the first surface of the substrate.

3. A semiconductor device comprising:

a substrate that includes an organic insulating material and a plurality of micro conductors dispersed in the organic insulating material; and a semiconductor element provided on the substrate, wherein the substrate has a first surface on which the semiconductor element is provided, and a second surface that faces the first surface, and a density of the micro conductors in an internal portion adjacent to the second surface of the substrate is higher than a density of the micro conductors in an internal portion adjacent to the first surface of the substrate.

4. The semiconductor device according to claim 3, further comprising an inorganic insulating film between the substrate and the semiconductor element.

5. The semiconductor device according to claim 3, wherein the organic insulating material includes polyimide.

6. The semiconductor device according to claim 3, wherein the substrate has a surface resistivity of $10^9$ Ω/sq. or less.

7. The semiconductor device according to claim 3, wherein each of the micro conductors has a diameter of 2 μm or smaller.

8. The semiconductor device according to claim 3, wherein the substrate includes a laminate of a first layer and a second layer, and the micro conductors are included in one or both of the first layer and the second layer.

9. The semiconductor device according to claim 8, further comprising an insulating layer between the first layer and the second layer.

10. The semiconductor device according to claim 3, wherein the substrate has a high-density region having a predetermined density of the micro conductors, and a low-density region having a density of the micro conductors lower than the predetermined density of the micro conductors in the high-density region.

11. The semiconductor device according to claim 10, further comprising a wiring line that is provided on the substrate and is opposed to the low-density region, out of the high-density region and the low-density region.

12. The semiconductor device according to claim 3, wherein the substrate is coupled to a ground potential.

13. The semiconductor device according to claim 3, wherein the semiconductor element comprises a thin-film transistor.

14. The semiconductor device according to claim 3, wherein the substrate comprises a flexible substrate.

15. The semiconductor device according to claim 3, wherein the micro conductors include metal or carbon.

16. The semiconductor device according to claim 3, further comprising:

a metal film on a side opposite to the semiconductor element with respect to the substrate and configured to couple the plurality of micro conductors to a ground potential.

* * * * *